United States Patent [19]

Heemstra

[11] Patent Number: 4,603,295
[45] Date of Patent: Jul. 29, 1986

[54] TWO-HEADED DC MAGNETIC TARGET PROXIMITY SENSOR

[75] Inventor: Frank W. Heemstra, Fort Washington, Md.

[73] Assignee: The United States of America as represented by the Secretary of the Navy, Washington, D.C.

[21] Appl. No.: 398,499

[22] Filed: Jul. 15, 1982

[51] Int. Cl.⁴ ............... G01B 7/14; G01N 27/72; G01R 33/02; G08C 21/00
[52] U.S. Cl. ............................... 324/207; 324/233; 324/234; 324/243; 340/870.32
[58] Field of Search .......... 324/82, 83 R, 207, 208, 324/233, 234, 236, 244, 253, 243, 254, 258, 260, 179, 206, 172; 340/870.31, 870.32

[56] References Cited

U.S. PATENT DOCUMENTS

| 3,260,930 | 7/1966 | Kawada ................ 324/253 |
| 3,403,329 | 9/1968 | Geyger . |
| 3,488,578 | 1/1970 | Stigmark ............... 324/208 |
| 3,491,289 | 1/1970 | Petrini . |
| 3,582,781 | 6/1971 | Uemura ................ 324/172 |
| 3,582,924 | 6/1971 | Uemura et al. ......... 324/172 X |
| 3,626,397 | 12/1971 | Uemura ............... 324/208 |
| 3,649,908 | 3/1972 | Brown ................ 324/253 |
| 3,662,257 | 5/1972 | Fujiwara . |
| 3,812,433 | 5/1974 | Bradley ............... 324/82 X |
| 3,855,525 | 12/1974 | Bernin ............... 340/870.32 X |
| 3,993,946 | 11/1976 | Makino ............... 324/208 |
| 4,013,945 | 3/1977 | Grosso . |
| 4,140,971 | 2/1979 | Blincoe ............... 324/208 |
| 4,205,266 | 5/1980 | Lichtenberg . |
| 4,225,966 | 9/1980 | Blow ................ 324/83 R X |
| 4,271,763 | 6/1981 | Berger . |
| 4,283,679 | 8/1981 | Ito et al. ............... 324/174 X |
| 4,303,885 | 12/1981 | Davis et al. ............ 324/233 X |
| 4,309,702 | 1/1982 | Mibu et al. ............ 324/208 X |
| 4,319,188 | 3/1982 | Ito et al. .............. 324/208 X |
| 4,355,364 | 10/1982 | Gudat ............... 340/870.32 X |
| 4,369,405 | 1/1983 | Sato et al. ............ 324/174 |
| 4,422,041 | 12/1983 | Lienan ............... 324/208 X |

FOREIGN PATENT DOCUMENTS 642647  1/1979  U.S.S.R. ............... 324/233

Primary Examiner—Gerard R. Strecker
Assistant Examiner—Warren S. Edmonds
Attorney, Agent, or Firm—Robert F. Beers; Sol Sheinbein; William T. Ellis

[57] ABSTRACT

A magnetic proximity sensor for detecting the proximity of a laterally moving magnetized target moving along a translation axis which is parallel to a line joining the targets magnetic poles, including: two ring-core flux-gate magnetometers disposed adjacent to each other with their axes of sensitivity in parallel, with both axes perpendicular to the magnetized target translation axis. The energizing coils of the flux-gate magnetometers are driven by an ac signal at frequency $f_o$. The signal on the detecting coils in each flux-gate magnetometer is applied to a phase comparator via a bandpass filter tuned to the second harmonic of $f_o$. When the signals applied to the phase comparator are of opposite phase, then the center plane equidistant from the target's magnetic poles is between the two axes of sensitivity of the magnetometers. When the signals are of the same phase, then the target's center plane is laterally outside of the these two axes.

5 Claims, 8 Drawing Figures

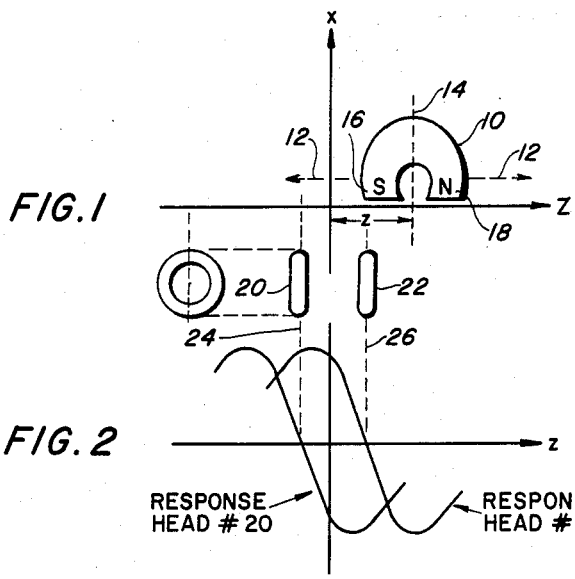
FIG.1
FIG.2
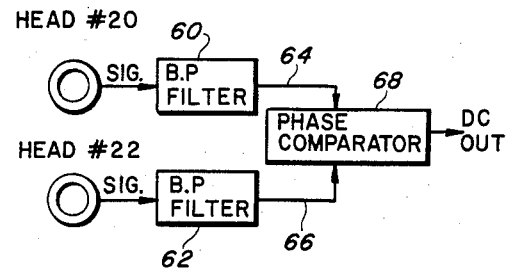
FIG.3
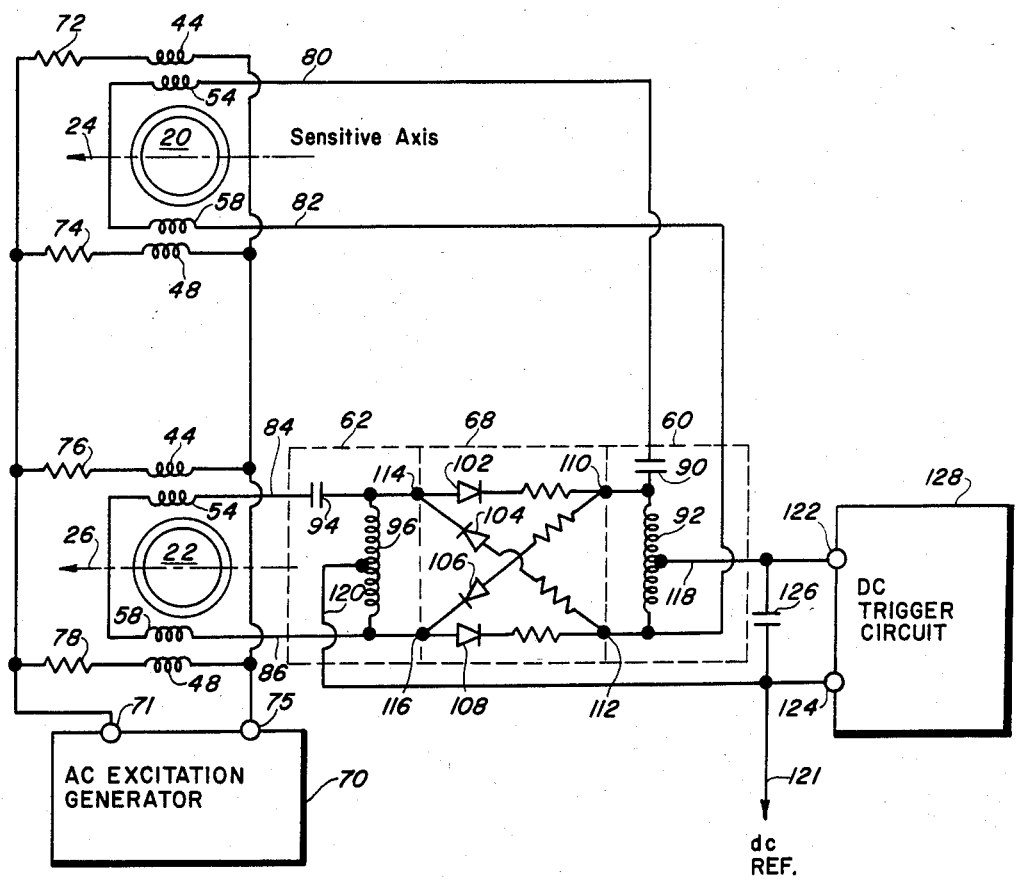
FIG.5

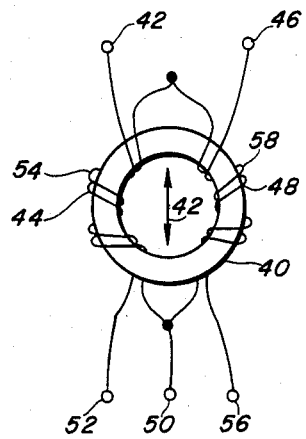
FIG.(4a)
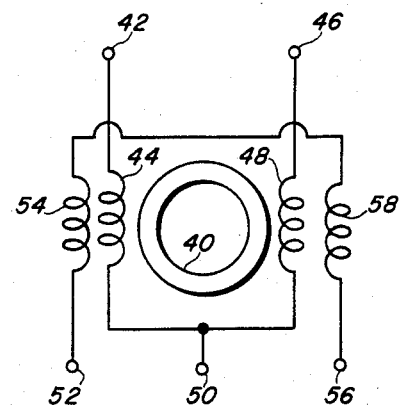
FIG.(4b)
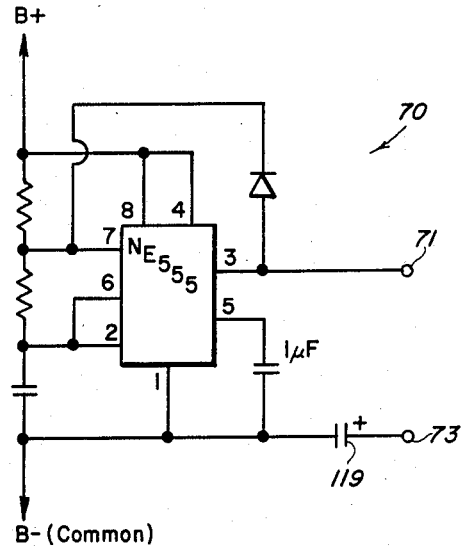
FIG.6
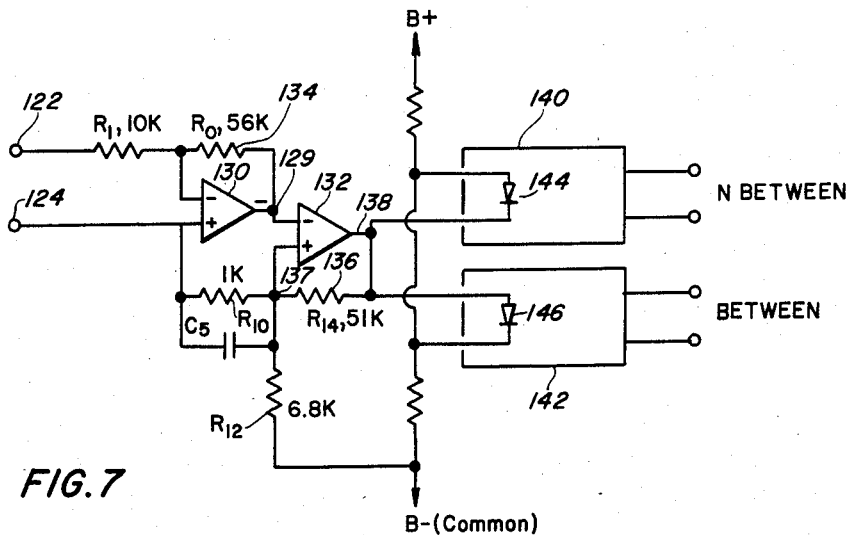
FIG.7

TWO-HEADED DC MAGNETIC TARGET PROXIMITY SENSOR

BACKGROUND OF THE INVENTION

The present invention relates generally to magnetic proximity detectors, and more particularly to magnetic proximity switches utilizing a dc magnetic flux as the physical property to be detected.

A magnetic proximity sensor using dc or permanent magnetism for the detection of either unmagnetized ferrous targets or permanently magnetized targets has a variety of advantages over other prior art proximity sensors. More specifically, such a dc magnetic proximity sensor can be more easily immunized against the effects of shock and vibration than magetically actuated mechanical switches because this sensor has no moving parts. Moreover, in contrast to devices using optical windows, the operation of this dc field sensor is unimpaired by dirt, paint, or grease. Additionally, unlike devices utilizing alternating fields, a permanent magnetic sensor can be made impervious to all but very low frequency electromagnetic radiation by using conductive shielding. Moreover, since the source of the field for this device may be a permanent magnet, it can be made very strong as compared to an ac source, without the need to generate it electronically from a power source. Finally, it should be noted that a dc magnetic field sensing device is sensitive to the sense as well as the amplitude of the field. In this regard, the direction of the magnetic vector field of a magnetized target is determined entirely by geometry. Consequently, this sensor can be used to indicate sharply defined positions along a target's line of travel where the field component sensed by the device reverses direction.

However, dc magnetic field proximity sensors in general, and sensors of the type defined in patent application Ser. No. 398,500, filed July 15, 1982, by Frank Heemstra, entitled "DC Magnetic Field Proximity Sensor", now Pat. No. 4,488,113, in particular, have their exact range fixed by a given field threshold level which, in turn, is determined by the strength of the internal magnet used therein, the field strength of the target if a magnetized target is used, and the sensitivity of the detector. For uniformity of results, these quantities must be specified and kept within certain tolerances, thereby limiting the operation of the device.

OBJECTS OF THE INVENTION

Accordingly, it is an object of the present invention to provide a dc magnetic proximity sensor which has a sharply defined narrow range of target proximity.

It is a further object of the present invention to provide a dc magnetic field sensor which has a sharply defined narrow range of target proximity that, within limits, is virtually independent of the magnetic strength, the detector sensitivity, or spacing between the line of travel of the target and the proximity sensor.

Other objects, advantages, and novel features of the present invention will become apparent from the detailed description of the invention, which follows the summary.

SUMMARY OF THE INVENTION

Briefly, the invention comprises a proximity sensor for sensing the proximity thereto of a magnetized target adapted to move laterally along a z axis, including a first magnetic flux sensor disposed with its axis of sensitivity perpendicular to and intersecting with the z axis, a second magnetic flux sensor disposed adjacent to the first flux sensor with its axis of sensitivity parallel to the axis of sensitivity of the first flux sensor and perpendicular with and intersecting the z axis, wherein the first and second flux sensors sense in their respective axes of sensitivity the change in flux polarity as the magnetized target moves laterally along the z axis, with its poles positioned to direct components of magnetic intensity of opposite sense parallel to the axes of sensitivity of the first and second flux sensors, and further including circuitry for comparing the polarities of the flux sensed by the first and second flux sensors and for generating an output signal indicative thereof.

In a preferred embodiment, the first and second magnetic flux sensors may comprise ring-coreflux-gate magnetometers. Each magnetometer includes at least two energizing windings and at least two detecting windings wound on a ring core with one winding of each type disposed on each side of a diametrical axis of the core coincident with the axis of sensitivity for the magnetometer. The energizing windings are driven by an ac signal at frequency $f_o$. When flux is sensed by one of these magnetometers, a signal at the second harmonic of the frequency $f_o$ is generated in the detecting windings thereof. The polarity comparing circuitry thus may comprise a pair of bandpass filters tuned to the second harmonic of $f_o$ for filtering the output signals from the detector windings of each magnetometer and applying these signals to a phase comparator. This phase comparator provides a first output signal when the signals are of the same phase, and a second output signal when the signals are of opposite phase.

BRIEF DESCRIPTION OF THE DRAWINGS

FIG. 1 is a schematic diagram of the magnetic flux sensing heads in relation to a laterally moving target.

FIG. 2 is a graph of the response of each head shown in FIG. 1 as a function of the z axis displacement of the target.

FIG. 3 is a block diagram of one embodiment of the polarity sensing circuitry which may be utilized to implement the present invention.

FIG. 4(a) is a front view of one type of winding arrangement which may be utilized on a ring-core fluxgate magnetometer.

FIG. 4(b) is a schematic diagram of the winding arrangement shown in FIG. 4(a).

FIG. 5 is a schematic circuit diagram of one implementation of the block diagram shown in FIG. 3.

FIG. 6 is a schematic circuit diagram of one embodiment of an ac excitation oscillator which may be utilized with the circuit of FIG. 5.

FIG. 7 is a schematic circuit diagram of one embodiment of a triggering and output circuit which may be utilized with the circuit shown in FIG. 5.

DETAILED DESCRIPTION OF THE PREFERRED EMBODIMENT

Referring now to the drawings, wherein like reference characters designate like or corresponding parts throughout the views, FIG. 1 shows the double magnetic sensor head configuration of the present invention in relation to a magnet target. In the drawing is shown a magnetic target 10 which is adapted to move laterally along or parallel to a z axis in an x-z coordinate system. This direction of lateral translation is shown by the arrows 12. The position of the magnetized target 10 is measured from the z=0 point on the z axis to the center line 14 between the target's magnetic poles 16 and 18. This target 10 may take a wide variety of configurations with the only requirement being that it direct a component of magnetic intensity parallel to the x axis on the right side of the center line 14 in one sense, and a component parallel to the x axis in the opposite sense on the left side of the center line 14. In the present embodiment, such a target was simply realized by utilizing a horseshoe magnet with the poles 16 and 18 positioned on a line parallel to the z axis as shown in the figure.

Two magnetic flux sensors 20 and 22 are disposed adjacent each other with their axes of sensitivity parallel to each other with both axes of sensitivity 24 and 26 intersecting the z axis along which the target 10 laterally translates.

A graph shown in FIG. 2 represents the response of the magnetic flux sensor heads 20 and 22 as the magnetic target 10 laterally translates along the z axis. It can be seen from this graph that when the center line 14 of the target 10 moves laterally toward the sensor heads, the sensor head 22 will have a response with a negative polarity until the center line 14 is coincident with the axis of sensitivity 26 for the sensor 22. As the target center line 14 moves to the left past this axes coincidence point, the phase sensed in the sensor head 22 becomes positive. Likewise, as the target center line 14 moves to the left the response of the sensor head 20 will have a negative polarity until the center line 14 is coincident with the axis of sensitivity 24 for the sensor head 20. As the center line 14 of the target moves to the left past this axis coincidence point, the polarity of the response of the sensor head 20 becomes positive. From the above, it can be seen that the only time when the fluxes sensed by the sensor heads 20 and 22 can have opposite signs will be when the center line 14 for the target 10 is located between the axes of sensitivity 24 and 26 of the sensor heads 20 and 22, respectively. When the center line 14 of the target is disposed outside of these two axes of sensitivity 24 and 26, then the signs for the flux sensed by the two sensor heads will be the same, either both negative or both positive.

Accordingly, it can be seen that by simultaneously sensing the x-component of magnetic intensity at two locations having a fixed z axis displacement, the overall sensor can determine when the center of the target is between the two axes of sensitivity for the flux sensors. Thus, by using two sensing heads, it is possible to indicate a sharply defined narrow z axis range of target proximity, that is within limits, virtually independent of the magnetic strength, detector sensitivity, or distance of the target along the x axis. The length of this range is essentially the spacing between the two magnetic flux sensors.

Referring now to the magnetic flux sensing devices 20 and 22, they may be implemented utilizing a number of different flux sensing configurations. However, in a preferred embodiment, a ring core flux-gate magnetometer is utilized. The basic principles for such a magnetometer are disclosed in U.S. Pat. No. 3,403,329 by W. A. Geyger. The winding arrangement for this design is shown in FIG. 4(a) and a schematic representation thereof is shown in FIG. 4(b). In the design, the flux sensitive element comprises a saturable toroidal core 40 with a set of energizing coils 44 and 48 and a set of detecting coils 54 and 58 disposed thereon. The excitation windings 44 and 48 are disposed on each semi-circular side of an arbitrary diametrical axis 42 of the core 40 and are symmetrically spaced with respect to this axis. These coils are connected to an ac voltage generator (shown in FIG. 5 and FIG. 6). The polarity or phasing of the connections of these excitation windings is such that the magnetizing fields of the two coils aid each other to circularly magnetize the ring core 40.

Likewise, a pair of detector windings 54 and 58, symmetrically disposed on each semicircular side of the axis 42, is connected in series opposition so that the voltages induced therein by the excitation flux in the core 40 cancel in the detector circuit and yield a zero voltage when the device is in balance.

It should be understood that a variety of other winding arrangements are possible on the toroidal core 40. The only requirement is that symmetry is maintained with respect to a given axis and that the correct phasing and polarity of the connections are maintained. In this regard, the excitation windings must aid each other in magnetizing the toroidal core, while the detector windings must oppose each other in the detector circuit.

When the windings 44 and 48 are energized by the ac voltage, the voltage induced in the excitation windings by the rate of change of flux in the core 40 is approximately equal to the applied voltage. This is because of the low coil resistance and core reluctance. The quantity of magnetic flux of induction threading the coils is, therefore, the time integral of the voltage per turn of the excitation windings.

In this sensing head design, the excitation voltage per turn and the ac frequency are chosen such that the flux density (the time integral noted above, divided by the cross-sectional area of the core) reaches the saturation flux density of the core material near the mid point of each half cycle of the ac excitation voltage. (For practical purposes, the saturation flux density may be regarded as the maximum flux density that the core of a given material will hold.) When the saturation density is reached for the core 40, the flux will no longer increase inside the core and thus the voltage across the windings drops to 0. The supply voltage is then dropped across a pair of current limiting resistors to be discussed later.

If an external magnetic field having a component along the axis of symmetry 42 exists, it will act to strengthen the magnetizing force, H, on one semicircular side of the core 40 and weaken it on the other. Consequently, the side being aided by the external field will reach saturation and its voltage will drop to zero before the weakened side does. During the short time interval that only one side of the core is saturated, the induced voltages in the detector windings 54 and 58 do not cancel each other, thus causing a voltage spike in the circuit of the detector windings. On the opposite half cycle of the ac excitation voltage, the opposite side of the core reaches saturation first. However, since the induced voltages are also reversed, the voltage spikes in the detector circuit maintain the same polarity on each half cycle of the ac excitation.

Because the polarity of the voltage spikes due to this uneven saturation does not reverse on alternate half cycles, these voltage spikes constitute even harmonics of the excitation frequency on the windings 44 and 48. Thus, the detector circuit (to be described infra) is tuned to the second harmonic of the excitation frequency in order to receive a sinusoidal ac signal of twice the excitation frequency. The amplitude of this signal is a measure of the component of the external field intensity along the diametrical axis of symmetry of the sensing head.

It can be seen that when the sense of the external magnetic field through the sensor's axis of sensitivity is in one direction due to the proximity of one pole of the magnetic target, then a signal with spikes of one polarity is obtained. Likewise, if the sense of the external magnetic field through the sensor's axis of sensitivity is in the opposite direction due to the proximity to the other pole of the target, then a signal with spikes of the opposite polarity is obtained.

The required excitation frequency, voltage, and current capability are interrelated with the magnetic properties of the ring core 40 and the number of turns on the excitation windings. In this regard, the saturation flux of the core (saturation flux density, $B_s$, times the cross-sectional area of the core) determines the number of turns of wire needed on the excitation windings for operation at a given voltage and frequency. In the present design, the excitation voltage per turn is chosen to be such that the core reaches saturation about half way through each half cycle of the ac excitation voltage. For an ac square wave excitation, this condition is satisfied when the number of turns is:

$$N = \frac{V \times 10^5}{8 f_o B_s A}$$

where:
N = number of turns on each winding,
V = excitation voltage on each winding,
$f_o$ = frequency of ac square wave voltage,
$B_s$ = saturation flux density of the core material in kilogauss,
A = cross-sectional area of the core in square centimeters.

For good performance of the sensing head, a sufficient magnetizing force, H must be generated when the maximum flux density, $B_s$, is reached to drive the core well into saturation. This magnetizing force is generated by the ampere-turns obtained when the voltage across the windings 44 and 48 drops to zero. This magnetizing force is limited by the current limiting resistors and determines the current capability required of the excitation source. For good results, the limited current should produce a magnetizing force, H, which exceeds that required to reach saturation, as determined by the magnetic characteristics of the core material, by a large factor.

It is generally found to be advantageous to use a core 40 of a material that requires less of a magnetizing force, in order to reduce the ampere-turns necessary in the system. Although the present design utilized a core of Deltamax, it is estimated that the excitation power requirements could be considerable improved by the use of a core material such as Supermalloy. A proper choice of such core material would decrease the magnetizing force required thereby allowing a decrease in the number of turns on the excitation windings with a corresponding increase of the cross-sectional area for increased signal strength.

Referring now to the construction of the core 40, a toroidal core wound from thin ribbons of nickel-iron alloys may be utilized. Such cores are commercially available. The frequency $f_o$ utilized as the ac excitation frequency in the present design may be, by way of example, 5 kHz. For operation at this excitation frequency, a tape thickness for the core of 1 mil or less is recommended. For ease of fabrication of the sensory heads, the excitation and detector windings may be bifilar, but this method of winding is not essential, nor is it necessary that the detector windings have any prescribed number of turns. The signal voltage generated will increase with the number of turns on the detector windings. It should also be noted that although the two excitation windings 44 and 48 are connected to be driven in parallel for simplicity of coupling to a single-ended source, this type of excitation connection is certainly not required.

From the above, it can be seen that when flux from an external magnetic field is present along the axis of sensitivity 42 of the flux sensors, the saturation times for the different semi-circular halves of the core 40 will be different thereby causing a voltage spike each time the core goes into saturation. These voltage spikes are generated at a frequency equal to the second harmonic of the ac excitation frequency $f_o$. Accordingly, it can be seen that by filtering the signal outputs from the flux sensor heads 20 and 22 at the second harmonic and then applying these filtered signals to a phase comparator, it can be determined when the center line 14 of the target is disposed between the axes of sensitivity 24 and 26 of the flux sensors. A block diagram of the above-described signal processing is shown in FIG. 3. A bandpass filter 60 is tuned to the second harmonic of the frequency $f_o$ and acts to filter the signal applied from the detector windings of the sensor head 20. Likewise, the bandpass filter 62 is tuned to the second harmonic of the frequency $f_o$ and acts to filter the signal from the detector windings of the sensor head 22. The filtered output signals from these two bandpass filters are applied on the lines 64 and 66 to the inputs of a phase comparator 68. The phase comparator 68 compares the phases of the filtered signals and provides a first output signal when these signals are of the same phase, and a second output signal when the signals are of opposite phase.

A detailed circuit schematic diagram which may be utilized to implement the block diagram of FIG. 3 is shown in FIG. 5. An ac generator 70 applies an ac signal such as, by way of example, a square wave or a sine wave, through four current limiting resistors 72, 74, 76, and 78 to the respective excitation windings of the two core sensing heads 20 and 22. In particular, the ac excitation through the limiting resistors 72 and 74 are applied respectively to the excitation windings 44 and 48 for the core sensor head 20. Likewise, the ac excitaton on the current limiting resistors 76 and 78 is applied to the excitation windings 44 and 48, respectively, of the core sensor head 22. As noted previously, the detector windings 54 and 58 for each core are connected in phase opposition such that when there is no external magnetic field to cause unbalanced saturation in the core 40, then there is no signal output therefrom. However, when an external magnetic field through the sensitive axis of the core does unbalance the saturation times for the different semi-circular sections of the core, then a series of voltage spikes at a frequency equal to the second harmonic of the ac excitation frequency $f_o$ is generated. For the core sensor head 20, the output signal at the second harmonic of the excitation frequency, $f_o$, is applied on the lines 80 and 82 to the bandpass filter 60 which is tuned to the second harmonic of $f_o$ and acts to generate a sine wave excitation only when the second harmonic is present. Likewise, for the core sensor head 22, the ac excitation at the second harmonic is applied via the lines 84 and 86 to the bandpass filter 62 which is also tuned to the second harmonic of $f_o$. In the circuit embodiment of FIG. 5, the bandpass filter 60 is formed by a tuning capacitor 90 in series connection with a center tapped inductor 92. Likewise, the bandpass filter 62 is implemented by a tuning capacitor 94 in series connection with a center tapped inductor 96.

The phase comparator 68 is implemented, in this embodiment, simply by means of a double balanced diode ring demodulator comprising four appropriately connected diodes 102, 104, 106, and 108. The center-tapped inductor 92 of the bandpass filter 60 is connected to the balanced diode ring 68 at the points 110 and 112. Likewise, the center tapped inductor for the bandpass filter 62 is connected to the balanced diode ring at the points 114 and 116. It can be seen that the foregoing circuit is symmetrical.

The output of the phase comparator is a DC electrical potential difference generated between the center tap (line 118) on inductor 92 and the center tap (line 120) on inductor 96. Because the filtered AC signal inputs to the diode ring are balanced with respect to these center taps, the second harmonic signal is cancelled in the output of the phase comparator. However, rectification of the AC signal by the diodes in the comparator creates a ripple voltage on the DC output at twice the frequency of the second harmonic AC signal. Thus, the ripple frequency is the fourth harmonic of the excitation frequency of the sensing heads. This AC ripple component, and any residual second harmonic signal resulting from imperfect balance of the center tapped inductors, is filtered out of the DC output by capacitor 126 connected between the two center taps on output lines 118 and 120.

The entire phase comparator circuit, including the diode ring 68, harmonic filters 60 and 62, and both sets of detector windings 54 and 58, is electrically isolated for DC in the same way that the separate windings of a transformer are isolated. Because of this isolation, either center tap, line 118 or line 120, may be used as DC signal output of the phase comparator with the other one used as the signal return or common terminal, just as either terminal of a battery may be grounded depending on the output polarity desired. Also, because of the isolation, the common or return side of the output may be fixed at whatever bias, offset, or reference voltage level that is desired for proper operation of any triggering circuitry to following the phase comparator. The DC output signal of the phase comparator is then superimposed on the fixed voltage level applied to the return side of the phase comparator.

The polarity of the DC voltage difference between output lines 118 and 120 indicates the position of the magnetized target with respect to the sensing axes 24 and 26. The phasing of the detector winding connections and polarity of the diodes shown in the diagram is such that when the magnetic field component parallel to the sensitive axes has the same sense at both sensing heads, (as indicated by the arrows in the diagram of FIG. 5), then the voltage on line 118 is negative with respect to line 120. Likewise, when the field components measured by sensing heads 20 and 22 are of opposite senses, then the voltage on the center tap of inductor 92 (line 118) is positive with respect to the center tap of inductor 96 (line 120). This polarity will be reversed if the leads t the detector windings 54 and 58 on one of the sensing heads (but not both) are reversed. Also if the polarities of all the diodes in the diode ring 68 are reversed, the output polarity will be reversed.

Although the present filter and phase comparator design has been implemented with passive circuits for convenience, it can be just as easily implemented using active filters and an active phase detector. Such a design would eliminate the need for tuned transformers and inductors which must be wound to specification.

FIG. 6 is a schematic diagram of one circuit which may be utilized as the ac generator 70. The design shown in FIG. 6 utilizes an NE555 integrated timer circuit made by Fairchild Corporation as a free running multi-vibrator to generate a square-wave excitation voltage. The values shown in the external biasing circuitry provide an operating frequency of 5 kHz and a duty cycle of 50%. Since the output of the NE555 is a train of dc pulses, a series blocking capacitor 119 is used to prevent direct current from flowing in the excitation windings 44 and 48 of the sensing heads. Thus, the dc component is dropped across the capacitor 119 and the voltage applied across the load (the excitation windings 44 and 48) and the current limiting resistors 72, 74, 76, and 78 is an alternating symmetrical square-wave of half the dc pulse voltage appearing on pin 3 of the NE555. It is recommended that this capacitor 119 be electrolytic in order to have a small reactance at the excition frequency $f_o$ relative to the parallel resistance of the current limiting resistors. The series blocking capacitor 119 is placed in the circuit on the return side of the excitation windings as a convenient method of providing a dc reference or bias voltage for the trigger circuit.

As noted above, the function of the dc trigger circuit 128 is to generate a trigger signal whenever the center line of the ferrous target is between the core sensor heads 20 and 22, but laterally displaced therefrom. This positioning of the target is indicated by the polarities of the voltages at the inputs 122 and 124 to the dc trigger circuit 128.

A wide variety of circuit embodiments could be used to implement a dc trigger circuit which could be designed to trigger in accordance with the polarity changes at the input points 122 and 124. Typically, such a circuit would be implemented with one or more operational amplifiers. The design should have circuitry to provide a threshold voltage below which the circuit will not trigger. The purpose of the threshold is to prevent the triggering of the circuit when the output difference voltage between the points 122 and 124 is zero (no target in the vicinity), or triggering by voltage noise spikes. Typically, this threshold will be implemented on the positive side.

FIG. 7 is a schematic diagram of one circuit embodiment which may be used to implement the trigger circuit. This circuit is designed to generate a trigger signal when the voltage on input 122 is above a certain threshold level relative to the voltage on input 124 (indicating that the polarities are the same at the sensing heads).

In this circuit on operational amplifier 132 is utilized as the triggering circuit and the 4N33 opto-couplers 140 and 142 noted previously are used as the BETWEEN and NOT BETWEEN target proximity indicators. In the present implementation, this trigger signal is taken from center tap line 118 which goes positive with respect to line 120 when the target is between the sensor heads. This trigger signal on line 118 is applied to the inverting input of the 741 operational amplifier 130. Op amp 130 acts to invert the voltage on line 118 (input 122), and the gain therefrom is used to set a triggering sensitivity for the circuit. In order to properly bias the op amp inputs relative supply voltage, a positive reference voltage is applied to the non-inverting input 124 of amplifier 130 via line 121 connected to line 120. For ease of implementation, line 121 is connected to the blocking capacitor 119 (FIG. 6), as a positive reference voltage source. Op amp 130 has a negative feedback connection via the resistor 134 on the inverting input of the amplifier in order to make it a linear amplifier. Regarding the op amp 130 configuration, it was found that a non-inverting configuration tended to pick up voltage spikes believed to originate in the sensing head. Use of the present inverting configuration allows the filtering of such spikes, if necessary, by the addition of a small integrating capacitor (not shown) across the feedback resistor 134.

As noted above, the operational amplifier 132 is the trigger for the circuit. This amplifier 132 is connected in a positive feedback configuration by means of the feedback resistor 136 connected between the output line 138 from amplifier 132 and the positive or non-inverting input to the amplifier (point 137). This positive feedback causes the output amplifier 132 to be latched either high or low depending on the input conditions thereto. In either condition of latching, the voltage applied to the non-inverting input of the amplifier 132 by the feedback resistance network is negative with respect to the reference voltage on the line 121. Thus, when the dc signal input from the output of amplifier 130 to the inverting input of the amplifier 132 is zero or positive relative to the voltage on line 124 (indicating a zero or negative dc signal at the input 122), then the inverting input (point 129) is more positive in voltage than the voltage to the non-inverting terminal. Thus, the voltage output from the amplifier 132 is negative, ie. the output is latched low to the negative side of the power supply. When the output on line 138 from the amplifier 132 is negative, then the light emitting diode 144 in the opto-coupler 140 is biased into conduction indicating that the target is not between (N BETWEEN) the sensor heads. Likewise, the light emitting diode 146 in the opto-coupler 142 is biased negative into a nonconducting state.

When the voltage to the inverting terminal 129 of the amplifier 132 is negative (indicating a positive voltage at input 122) by an amount which exceeds the negative voltage applied to the non inverting input 137 of the amplifier 132, then the amplifier 132 saturates positive and provides a positive output on the line 138. In essence, the output line 138 is now latched high to a voltage near the positive supply voltage. The high voltage on the line 138 biases the light emitting diode 144 into non-conduction, while biasing the diode 146 into conduction. Thus, the light emitting diode 146 indicates that the target is between the sensor heads.

It should be noted that the positive feedback resistor 136 on the amplifier 132 provides "snap-action" switching by creating a hysteresis in the switching level. The hysteresis action of this circuit can be understood by noting that point 129 at the inverting terminal of the amplifier 132 must be more positive in voltage than the point 137 at the non-inverting terminal in order to turn the amplifier 132 off. However, the voltage at the non-inverting terminal 137 is dependent on whether the amplifier 132 output terminal 138 is ON (high) or OFF (low). It is less negative with respect to the reference voltage on line 114 when the amplifier 132 is ON than when it is OFF. Thus, after the amplifier 132 has been triggered ON, it will not turn OFF again until the signal level drops below a second threshold that is less than the level required to trigger it ON. The magnitude of this hysteresis, i.e. the difference between the ON and OFF triggering voltages for amplifier 132 is given by $$\Delta V = (V_H - V_L) R_p / R_{14},$$

where $V_h$ and $V_L$ are the high and low latched output voltages respectfully, and $R_p$ is the parallel resistance of $R_{10}$, $R_{12}$, and $R_{14}$ shown in the figure. On the valid assumption that $R_p/R_{14}$ is much less than one, and that $\frac{1}{2}(V_H + V_1)$ is approximately equal to the dc reference voltage, the mid point between the ON and the OFF input triggering voltages is equal to the dividing ratio, $R_{10}/(R_{10} + R_{12})$, times the dc reference voltage on line 121.

The output circuit is electrically isolated from the sensor circuitry. The parallel connection of the light emitting diodes 144 and 146 in reverse directions insures that whenever one opto-coupler is turned ON, the other opto-coupler is OFF. This reverse parallel connection also protects each of the diodes 144 and 146 from excessive reverse voltage.

As noted above, by using the two flux sensing head configuration of the present invention, it is possible to indicate a sharply defined narrow z axis range of target proximity that, within limits, is virtually independent of the magnetic strength of the target, the detector sensitivity, and the spacing between the target and the flux sensors. The length of this range is essentially the spacing between the two magnetic flux sensors. In the preferred embodiment utilizing ring-core flux-gate magnetometers as the flux sensors, it is estimated that by orienting the two ring cores in parallel planes, they can be spaced as close as one quarter inch apart. Thus, the present proximity sensor could be made to give an output signal whenever the center of the target is within plus or minus ⅛ inches of a fixed center plane.

It should be noted that a sensor of this type would have good immunity from false indications or triggering by spurious magnetic fields because, for a close spacing between the sensing heads, the spurious field will generally have the same direction or sense at both of the sensing heads.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A proximity sensor system comprising:
    a dc magnetized target including means for moving laterally along a z axis, said target having a reference line perpendicular to and intersecting said z axis, with a single set of dc magnetic poles positioned to direct a first component of magnetic intensity of one sense parallel to and on one side of said target reference line and intersecting said z axis, and to direct a second component of magnetic intensity of opposite sense to said first intensity component parallel to and on the opposite side of the target reference line from said first intensity component and intersecting said z axis;
    a first dc magnetic flux sensor for sensing flux polarity disposed with its axis of sensitivity perpendicular to and intersecting with said z axis and parallel to said target reference line;

a second dc magnetic flux sensor for sensing flux polarity disposed adjacent said first flux sensor with its axis of sensitivity parallel to the axis of sensitivity of said first flux sensor and perpendicular with and intersecting said z axis;

wherein said first and second flux sensors sense in their respective axes of sensitivity the change in flux polarity as the magnetized target moves laterally along said z axis directing its first and second components of magnetic intensity of opposite sense parallel to the axes of sensitivity of said first and second flux sensors; and means for comparing the polarities of the flux sensed by said first and second flux sensors and generating an output signal indicative thereof.

2. A proximity sensor as defined in claim 1, wherein said first and second magnetic flux sensors comprise ring core flux gate magnetometers.

3. A proximity sensor as defined in claim 2, wherein each of said flux gate magnetometers comprise:

a toroidal ring core with a diametrical axis therethrough coincident with said axis of sensitivity;

at least two energizing windings wound on said core with the energizing windings balanced one on each semicircular side of said diametrical axis;

means for energizing said at least two energizing windings with a predetermined ac signal at a frequency $f_o$; and at least two detector windings wound on said core with the detector windings balanced one on each semicircular side of said diametrical axis.

4. A proximity detector as defined in claim 5 or 3, wherein said comparing means comprises:

a first bandpass filter tuned to the second harmonic of the frequency $f_o$ for filtering the output signal from the detector windings of said first flux sensor;

a second bandpass filter tuned to the second harmonic of the frequency $f_o$ for filtering the output signal from the detector windings of said second flux sensor; and a phase comparator for comparing the phases of the filtered signals from said first and second bandpass filters and providing a first output signal when the signals are the same phase, and a second output signal when the signals are of opposite phase.

5. A proximity detector as defined in claim 1, wherein said first and second magnetic flux sensors are not disposed on said z axis, and wherein said dc magnetized target includes means for moving said target along said z axis on both sides of at least one of said magentic flux sensors.

* * * * *